(12) United States Patent
Calame (10) Patent No.: US 10,268,115 B2
(45) Date of Patent: Apr. 23, 2019

(54) MANUFACTURE OF A MULTI-LEVEL TIMEPIECE COMPONENT

(71) Applicant: ROLEX SA, Geneva (CH)

(72) Inventor: Florian Calame, Epalinges (CH)

(73) Assignee: ROLEX SA, Geneva (CH)

( * ) Notice: Subject to any disclaimer, the term of this patent is extended or adjusted under 35 U.S.C. 154(b) by 257 days.

(21) Appl. No.: 14/967,091

(22) Filed: Dec. 11, 2015

(65) Prior Publication Data
US 2016/0179001 A1 Jun. 23, 2016

(30) Foreign Application Priority Data
Dec. 19, 2014 (EP) .................... 14199218

(51) Int. Cl.
| | | |
|---|---|---|
| *B32B 3/30* | (2006.01) | |
| *G03F 7/00* | (2006.01) | |
| *B81C 99/00* | (2010.01) | |
| *G04B 15/14* | (2006.01) | |
| *B32B 15/01* | (2006.01) | |

(52) U.S. Cl.
CPC ............. *G03F 7/0035* (2013.01); *B32B 3/30* (2013.01); *B32B 15/01* (2013.01); *B81C 99/008* (2013.01); *G04B 15/14* (2013.01); *B81B 2203/0307* (2013.01)

(58) Field of Classification Search
None
See application file for complete search history.

(56) References Cited

U.S. PATENT DOCUMENTS

| | | | | |
|---|---|---|---|---|
| 3,335,562 | A | * | 8/1967 | Schneider .............. G04B 15/12 368/133 |
| 2010/0243606 | A1 | | 9/2010 | Fiaccabrino et al. |
| 2013/0279307 | A1 | | 10/2013 | Fiaccabrino et al. |

FOREIGN PATENT DOCUMENTS

| | | |
|---|---|---|
| CH | 701 266 A2 | 12/2010 |
| CH | 704 806 A2 | 5/2012 |
| EP | 0 851 295 A1 | 7/1998 |
| EP | 2 060 534 A1 | 5/2009 |
| EP | 2 405 300 A1 | 1/2012 |

OTHER PUBLICATIONS

European Search Report dated Jul. 8, 2015 issued in corresponding EP Application No. EP14199218; with English partial translation and partial machine translation (11 pages).
European Search Report dated Jul. 6, 2015 issued in EP Application No. EP14199213, co-pending U.S. Appl submitted concurrently; with English partial translation and partial machine translation (7 pages).

* cited by examiner

*Primary Examiner* — Adam Krupicka
(74) *Attorney, Agent, or Firm* — Westerman, Hattori, Daniels & Adrian, LLP (57) ABSTRACT

A process for manufacturing a timepiece component, in particular a multi-level timepiece component, comprising a step of manufacturing at least one metal layer (13) of the timepiece component having an upper surface (15), wherein it comprises the following steps:
  E3: forming at least one cavity (14) in the upper surface (15) of the metal layer (13) of the timepiece component;
  E5: forming another metal layer (23) at least partially superposed on said upper surface (15) comprising a cavity (14), by a galvanic deposition of a metal or of an alloy, filling at least said cavity (14).

20 Claims, 6 Drawing Sheets

MANUFACTURE OF A MULTI-LEVEL TIMEPIECE COMPONENT

The present invention relates to a process for manufacturing a metal component by a photolithography and galvanic deposition technique. This type of process is used in particular for the manufacture of metal components that are in the form of multi-level three-dimensional microstructures, in order to form in particular timepiece movement components. The invention also relates to a metal component per se, obtained by such a manufacturing process.

DGC Mitteilungen No. 104, 2005, mentions the use of LIGA technology (LIthographie Galvanik Abformung: method devised by W. Ehrfeld of the Karlsruhe Nuclear Research Center, Germany) for the manufacture of high-precision metal timepiece parts, such as for example pallets or escape wheels. This process comprises the formation of a mold made of resin that is sensitive to X-rays, by irradiation with a high-energy X-ray beam generated by a synchrotron, which represents a major drawback.

A. B. Frazier et al., Journal of Microelectromechanical Systems, 2, 2, June 1993, describe the manufacture of metal structures by electroplating of metal in molds made of polyimide-based photoresist, which are prepared by means of a process using a technology referred to as LIGA-UV, similar to the LIGA technology mentioned above, but with UV illumination of the resist instead of X-ray irradiation.

Figure 1:
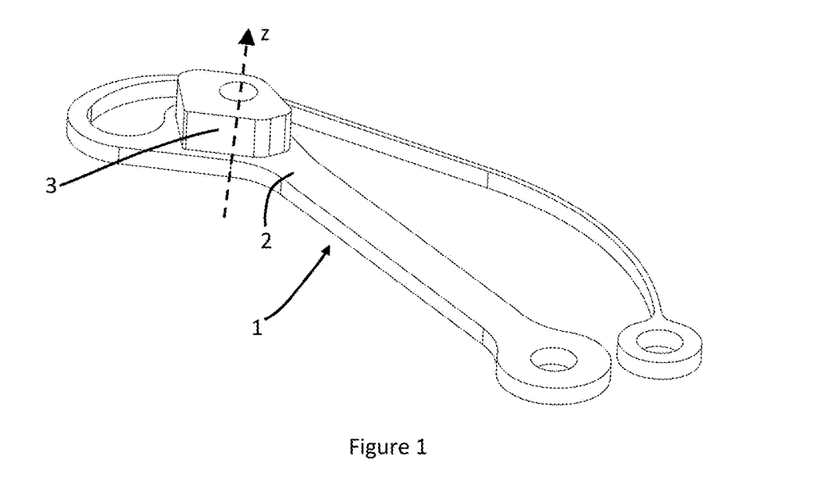
FIG. 1 represents a perspective view of a jumper for a timepiece movement.

The three-dimensional shapes of the timepiece components are often complex, and comprise discontinuities formed by superposed portions of very different cross sections. By way of example, FIG. 1 represents a jumper 1, comprising a lower portion 2 having a flat upper surface over which a second portion 3 extends. Such a three-dimensional shape is referred to as a "multi-level shape" since it is possible to distinguish two superposed portions 2, 3 having very different cross sections in a certain direction z, forming a discontinuity at their boundary, in the plane of the upper surface of the lower portion 2. Each portion 2, 3 comprises a cross section through a plane perpendicular to the direction z that is substantially constant or that varies continuously. If the portions of a component having a multi-level shape are produced by separate layers of galvanic deposition during the implementation of a LIGA process, a weakness of the resulting component is observed at the boundary between the separate layers, which may lead to an accidental separation of the layers. It is therefore advisable to define a process for manufacturing a multi-level timepiece component which enables it to withstand large mechanical stresses, in particular shear stresses and/or tensile stresses in a vertical direction.

Patent EP 2 405 300 describes various exemplary embodiments of a process for manufacturing a metal part having at least two levels. According to one particular exemplary embodiment, the process comprises the following successive steps:

depositing a first photoresist layer on a substrate covered with a conductive layer, this first layer defining a first level;
  obtaining a first mold by making a cavity in the first resist layer by photolithography with the aid of a mask, followed by development of the resist;
  depositing a metal or an alloy in the first mold, by a galvanic deposition initiated by the conductive layer, in order to form a first-level metal layer;
  completely removing the remaining resist from the first layer in order to leave only the first-level metal layer on the substrate;
  depositing a second resist layer on the substrate, for example of greater thickness than the first-level metal layer, then, by photolithography with the aid of a mask, followed by development of the resist, forming a hollow space delimited by the conductive layer, the side walls of the first-level metal layer and side walls of the second resist layer.

This hollow space ultimately constitutes a second mold in which it is possible to deposit a metal or alloy by a galvanic deposition initiated by the conductive layer and to form (after removal of the resist and of the substrate) a metal component having at least two levels interlocked with one another.

In summary, document EP 2 405 300 therefore proposes the manufacture of a multi-level component with the aid of separate layers obtained by a LIGA process, so that these separate layers are interlocked, which enables them to guarantee a good connection to one another, thus reducing the risk of the accidental separation thereof. However, this process is time-consuming in terms of production time and complexifies the resist molds to be manufactured for the formation of each layer.

Document EP 0 851 295 describes another approach based on the production of a photoresist microstructure with successive resist depositions and insolations, but a development of the insolated resist on a single occasion, in order to obtain a complex three-dimensional mold corresponding to the component to be manufactured. Next, the component is obtained by an electrolytic deposition within this mold. The advantage of this approach is in obtaining a monolithic metal assembly, the various levels being produced during a single step, therefore being able to be likened to a single layer. This results in a better mechanical strength of the portions of the various levels since there is no longer the weakness observed by the boundary between the separate layers. Its drawback is its complexity, in particular for forming the resist mold. This approach does not make it possible to obtain all the desired shapes either.

Thus, the object of the present invention is to improve the situation and to propose a solution for manufacturing a three-dimensional metal component with a satisfactory mechanical strength, in particular when it is in a form having at least two levels.

For this purpose, the invention relates to a process for manufacturing a timepiece component, in particular a multi-level timepiece component, comprising a step of manufacturing at least one metal layer of the timepiece component having an upper surface, wherein it comprises the following steps:

forming, by machining, at least one cavity in the upper surface of the metal layer of the timepiece component;
  forming another metal layer at least partially superposed on said upper surface comprising a cavity, by a galvanic deposition of a metal or of an alloy, filling at least said cavity.

The invention also relates to a timepiece component, in particular a multi-level timepiece component, comprising two adjacent levels formed by two separate metal layers that are at least partially superposed, the second metal layer at least partially covering the upper surface of the first metal layer, wherein the first metal layer has at least one blind cavity and wherein the second metal layer occupies the volume of said cavity of the first metal layer, so that the two metal layers are interlocked and/or embedded and fastened to one another at their interface. They are firmly attached and fastened (without moving) to one another. They form a monolithic assembly.

The first metal layer may have at least one cavity having a side wall that is not perpendicular to the upper surface of the first metal layer in the area around the cavity, in particular a side wall inclined so that the cross section of the cavity increases on moving away from the upper surface of the first metal layer or in particular a cross section of dovetail shape in a plane perpendicular to the upper surface of said component.

The invention is more particularly defined by the claims.

These subjects, features and advantages of the present invention will be explained in detail in the following description of particular embodiments given nonlimitingly in connection with the appended figures, among which.

A process will be described for manufacturing a metal component, particularly suitable for the manufacture of multi-level microstructures, in particular for manufacturing timepiece components. For the sake of simplicity, the terms "metal" and "metallic" will be used subsequently to denote a metal material or metal alloy.

The first step E1 of the manufacturing process consists in manufacturing a first mold having a first level N1 on a substrate 10. This substrate 10 may consist of a metal wafer in particular made of an alloy such as a stainless steel, or a silicon, glass or ceramic wafer. This substrate is preferably solid, but may also comprise structures produced by microfabrication. It is prepared according to the rules known to the person skilled in the art, in particular for the degreasing, cleaning, optionally passivation and/or activation thereof. This substrate is advantageously flat. As a variant it may comprise patterns, in particular machined patterns, and/or cavities and/or other structures, according to the teachings of the prior art. In particular, it may comprise housings for placing one or more inserts intended to be trapped or buried by the future metal layers deposited in order to finally be part of the metal component, in an immobile and non-removable manner. In the exemplary embodiment illustrated, the substrate 10 is made of a conductive material, for example of stainless steel. As a variant, it would also be possible to use a substrate made of a non-conductive material, such as for example silicon.

Optionally, a conductive layer 11 is deposited on the substrate 10, for example by evaporation. This conductive layer 11 is in particular intended to act as a cathode for the initiation of a subsequent galvanic deposition, or electroplating. In a known manner, this conductive initiation layer 11 may comprise a sublayer of chromium, nickel or titanium covered with a layer of gold or copper (it thus has a multilayer structure).

The conductive layer 11 is covered with an initial photoresist layer over a desired height. This height is preferably greater than 0 and less than or equal to 1.5 mm. The resist is a photoresist, suitable for photolithography. The resist may be negative or positive. In the first case, it is designed to become insoluble to, or difficult to dissolve by, a developer under the action of a radiation whilst, in the second case, it is designed to become soluble to a developer under the action of a radiation, whilst the portion not exposed to the radiation remains insoluble or difficult to dissolve. In the particular example of the description, the resist used is of "SU-8" type, which is a negative photoresist that polymerizes under the action of UV radiation, for example the SU-8-100 resist from Microchem. This initial resist layer defines a first level N1.

A step of photolithography of the initial resist layer is carried out, which consists in exposing the initial resist layer to light radiation, or insolating it, through a mask comprising openings and opaque regions. This mask defines the pattern to be reproduced for the production of the first level of the component to be manufactured. The light radiation used for irradiating or insolating the resist is here UV radiation emitted by a UV source. It could however be envisaged to use X-rays, an electron-beam (it is then referred to as electron-beam lithography) or any other type of radiation depending on the resist used. The radiation is perpendicular to the plane in which the mask extends so as to irradiate only the regions of the resist located at the openings made in the mask. In the particular exemplary embodiment described here, the insolated resist regions become insensitive or insoluble to most developing liquids.

The previous step of exposure to light radiation (or to an electron beam) is optionally followed by a crosslinking heat treatment step, then by a development step. The development consists in removing the unexposed resist regions according to a process adapted to the resist used, for example by dissolving with a chemical or by a plasma process. After dissolving, the conductive layer 11 appears at the locations where the resist has been removed. In the case of a positive photoresist, the insolated regions would be removed for example via a chemical process and the non-insolated regions would be retained on the substrate.

Figure 2:
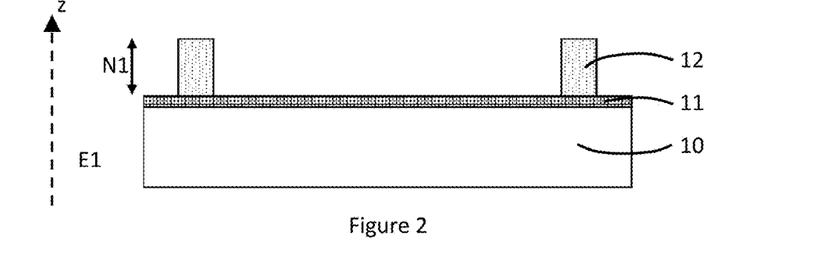
FIGS. 2 to 8 illustrate the successive steps of the process for manufacturing a metal component according to one embodiment of the invention.

The remaining portions of resist of the initial layer form a first resist mold 12 having a first level N1. The bottom of the mold is delimited by the conductive layer 11. At the end of the development step, the mold and the structure illustrated by FIG. 2 are therefore obtained, in which a substrate 10 is covered with a conductive layer 11, on which a resist mold 12 was formed over a first level N1. This construction is carried out in a single direction substantially perpendicular to the substrate 10, that will be referred to, by convention, as the vertical direction z, oriented upward in the figures so that the mold having a first level N1 is considered to be formed on top of the substrate 10, by convention. This flat substrate 10 likewise defines, by convention, a horizontal plane.

These steps of manufacturing a resist mold in an LIGA-type process are known and are not illustrated in greater detail.

Figure 3:
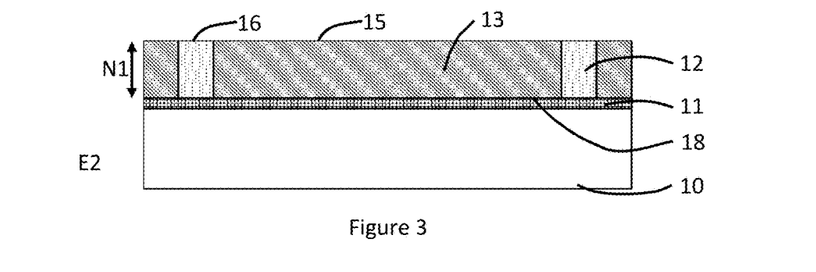

The next step E2 of the process consists in depositing a first metal layer 13 in the cavities of the first resist mold 12, by electroplating, or galvanic deposition. The conductive layer 11 according to the embodiment illustrated, or as a variant the substrate 10 if the latter is conductive, acts as a cathode for initiating the deposition. This step uses, for example, the LIGA process and a metal such as, for example, nickel (Ni) or nickel-phosphorus (NiP). The metal layer 13 obtained, represented in FIG. 3, may have the same height as that of the initial layer of resist, corresponding to the height of the resist mold 12. It may also have a height lower than the height of the resist mold 12, or a height higher than the height of the resist mold 12. Optionally, this step E2 may comprise a thickness-setting operation, by simultaneous mechanical polishing of the metal layer and of the remaining resist, in order to obtain a perfectly flat horizontal upper surface. The upper surface 15 of the metal layer is then perfectly aligned with the upper surface 16 of the resist mold 12, these two surfaces 16, 15 therefore defining the upper plane of the first level N1 of the intermediate structure obtained after this formation of a first metal layer 13. This plane is substantially horizontal in this embodiment.

As an embodiment variant that is not represented, the metal layer 13 might not occupy the entire height of the first mold 12, its upper surface 15 remaining below the upper surface 16 of the mold 12.

Figure 4:
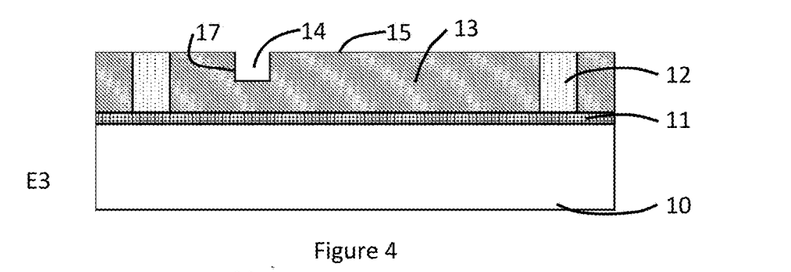

The process then comprises a step E3 of machining the first metal layer 13, in order to form a cavity 14, illustrated in FIG. 4. As will be explained in detail subsequently, the role of this cavity is to receive a portion of the second metal layer that will be superposed, in order to make it possible to interlock the two metal layers.

This step E3 of forming the cavity 14 comprises a step of mechanical machining, such as a milling and/or a drilling, or any other mechanical machining. As a variant, it may be carried out by laser ablation, for example using a femtosecond pulse laser. As a variant, a chemical machining, or an ultrasound machining, or an electrical discharge machining, or a localized machining by discharge in a dielectric medium may be used. Accordingly, said machining step is performed by using material removing processes, ingeniously combined with a distinct step of building a full metal or alloy layer with the additive process of electrodeposition.

This cavity 14 is formed by an action starting from the upper surface 15 of the metal layer 13. In this exemplary embodiment, and preferably, the final cavity 14 is in the form of a blind hole. This blind cavity may have various depths, which may extend to 90% at most of the height of the metal layer 13. The cavity may leave a minimum amount of material in the bottom of the cavity 14, having a height greater than or equal to 10 µm. In other words, the cavity 14 is separated from the substrate 10 by a thickness greater than or equal to 10 µm of material of the first metal layer 13. The depth of the cavity 14 may be chosen as a function of the final geometry of the component and according to the mechanical stresses that it will be subjected to, a greater depth ensuring a better interlocking of the two superposed layers and therefore a better final mechanical strength.

As a variant that is not represented, a cavity may be a through cavity, this step eliminating the metal of the first metal layer 13 over its entire height in a certain region, revealing a portion of the conductive layer 11 of the substrate.

In the embodiment illustrated by FIG. 4, the cavity 14 has side walls 17 that are substantially vertical, and therefore substantially perpendicular to the upper surface 15 of the metal layer 13.

According to one advantageous embodiment variant, the cavity 14 has side walls 17 that are inclined so that the cavity 14 has a horizontal cross section that is greater when the depth increases. As a variant, the side walls 17 may have any non-vertical shape (not completely perpendicular to the substrate), so that the cavity 14 comprises a horizontal flat cross section greater, at at least one depth below the level of the upper surface 15 of the metal layer 13, than its opening 19 level with the upper surface 15 of the metal layer 13. These side walls are thus not necessarily flat. They may be curved. They are not necessarily continuous either. They may be stepped. In any case, this approach further improves the relative anchoring of the two layers, in particular the anchoring or the hold in the vertical direction.

As a variant, several cavities, of different or identical dimensions, depth and/or geometry may be formed.

Figure 5:
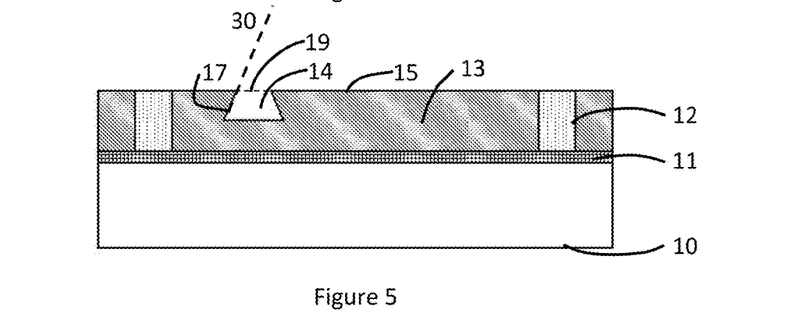

According to the embodiment illustrated by FIG. 5, the side walls 17 of the cavity 14 are inclined continuously so that the flat cross section of the cavity increases continuously with its depth below the upper surface 15 of the metal layer 13. In particular, the cavity illustrated has a cross section in a vertical plane of dovetail shape. This cavity may be machined with an angle cutter or a dovetail cutter, or by laser ablation with an oblique incidence of the laser beam 30.

Figure 6:
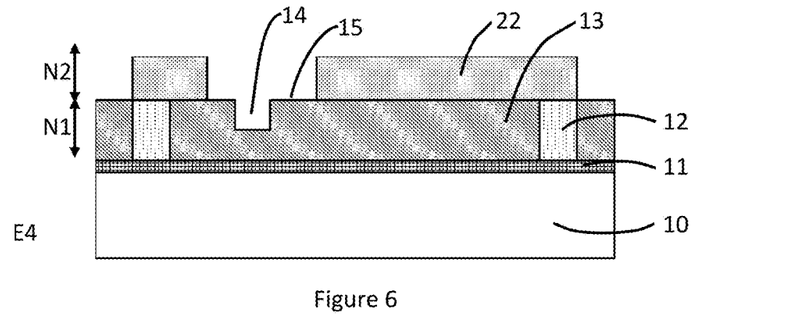

The process then comprises a step of depositing a second resist layer, in this example again an SU-8 negative photoresist layer. As a variant, a different resist may be used. This second layer is deposited so as to cover the first level N1. It thus defines a second level N2, extending vertically on top of the first level N1. The height of the second level N2 is advantageously strictly greater than 0 and less than or equal to 1.5 mm. It may be equal to or different from the height of the first level, depending on the height of the second level of the final component to be manufactured. As an observation, the resist also fills the cavity 14 of the first level N1. The step E4 of obtaining a second mold 22, as illustrated by FIG. 6, is finalized by photolithography of the second resist layer, via photolithography and developing steps, similar to those of the previous steps described in order to form the resist mold of the first level.

The process then comprises a second step E5 of electroplating or galvanic deposition, consisting in depositing a second metal layer 23 in the mold 22. This layer fills the entire volume of the cavity 14 then extends on top of the upper surface 15 of the first metal layer 13. It preferably has a height of at least 10 µm above the first metal layer 13, in particular above the cavity 14. It may fill all or some of the height of the second resist mold 22 of the second level N2. The metal layer 23 thus comprises an extension 27 which occupies the cavity 14.

Figure 7:
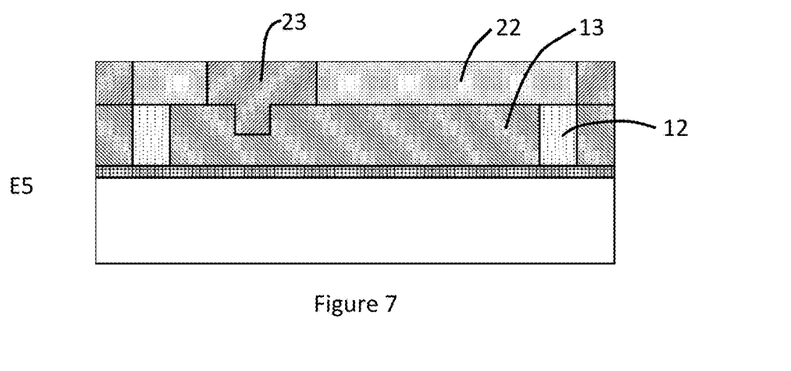

This step may be optionally followed by a thickness-setting operation, by mechanical polishing of the metal layer and of the resist. The result of this step is illustrated by FIG. 7.

As an observation, the electroplating of the second metal layer is here initiated by the deposited metal of the first level, both by its upper surface 15 and by the internal surfaces of the blind cavity 14. As a variant, it could be initiated by the conductive layer 11 covering the substrate 10 level with the cavity 14 if it is a through cavity.

The remaining resist of the levels N1 and N2 is then removed (or "stripped"), for example via a wet process or a dry process.

Figure 8:
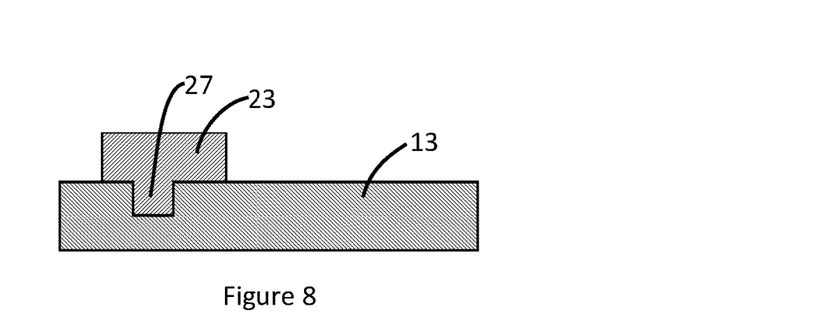

Similarly, the substrate 10 is removed, for example via a chemical process, for example by chemical dissolution of the conductive layer, in order to finally obtain the component illustrated by FIG. 8, which has two levels, each level corresponding to a separate metal layer 13, 23 issued by two distinct steps of the manufacturing process. These two layers, each layer being produced during a separate electroforming step, are interlocked, the second metal layer 23 comprising a lower extension 27 housed in the cavity 14 of the first metal layer 13.

As a variant, the substrate 10 could be detached before dissolving the resist. In this case, the remaining resist of the levels N1 and N2 and the components produced by electroplating would be detached from the substrate before removal of the resist.

Optionally, operations for reworking or machining or modifying the surface, such as the deposition of a coating, may be carried out on the electroplated components, whether this is before or after detachment of the substrate and/or before or after removal of the resist.

The manufacturing process has been illustrated with the aid of a simple component having two levels in order to facilitate the description of the embodiment. As a variant, it is naturally suitable for the manufacture of a more complex component, with for example more than two levels, obtained by the repetition of the steps of superposing metal layers. Among these layers, at least two superposed layers are interlocked, by a step of forming at least one cavity as explained above. Thus, the process described above can be reproduced in a similar manner in order to form two successive metal layers which are not necessarily the first two layers on top of the substrate. There may be several pairs of superposed metal layers interlocked with one another, or all the superposed layers may be interlocked with one another according to the same process as that described above, that is to say that any metal layer then comprises an extension in its lower portion interlocked in a cavity of the metal layer on which it rests.

As a variant, a first layer may even be interlocked with the two (or more) lower layers, by an extension passing entirely through the second layer immediately below, which comprises for this purpose a through cavity, and then interlocking in a cavity of the third layer located beneath the second layer. By this means, a layer may be anchored simultaneously in several lower layers.

The various metal layers of the component may be made of the same metal, or as a variant made of different materials.

The process finally has the following advantages:

the manufacturing time is optimal since it does not require formation of a complex resist mold in order to obtain the interlocking or embedding of superposed metal layers;

the formation of the cavity, the shape of which may be optimized, enables an optimal interlocking or embedding of the various layers. For example, the cavity with side walls that enlarge the cross section of the cavity, in particular in a dovetail, enables a very advantageous interlocking or embedding of the two superposed layers, which leads to an improved hold in the vertical direction and/or a better shear strength;

in any case, a second metal layer is grown from the bottom of the cavity of a first metal layer, which renders it intimately connected and anchored to the first metal layer and ensures the robustness of the assembly. The metal component obtained has several successive levels produced by separate, in particular electroformed, metal layers, at least some of which are interlocked and/or embedded, which makes it very robust, in particular with respect to shear stresses.

The process described above for manufacturing a metal component may be used for the manufacture of timepiece components such as, by way of illustrative and nonlimiting examples, a pallet, a jumper, a wheel, a rack, a spring, a balance, a cam, a gear or else a bridge. It may naturally also be used to manufacture any metal element in microstructure form.

Figure 9:
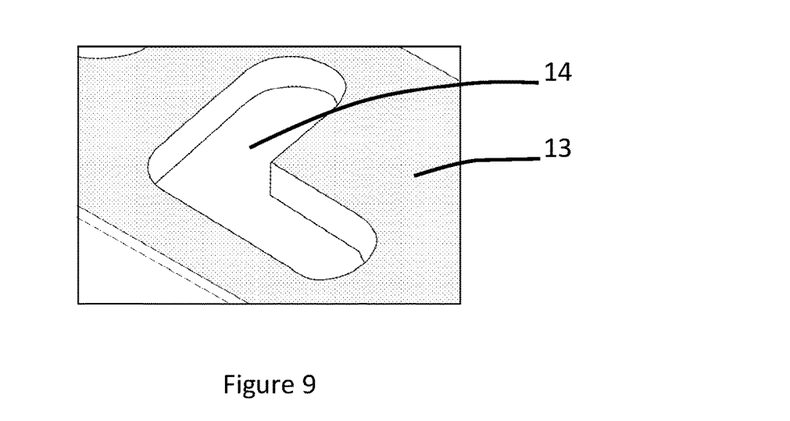
FIGS. 9 to 12 illustrate the implementation of the manufacturing process according to the embodiment of the invention for manufacturing a jumper.
Figure 10:
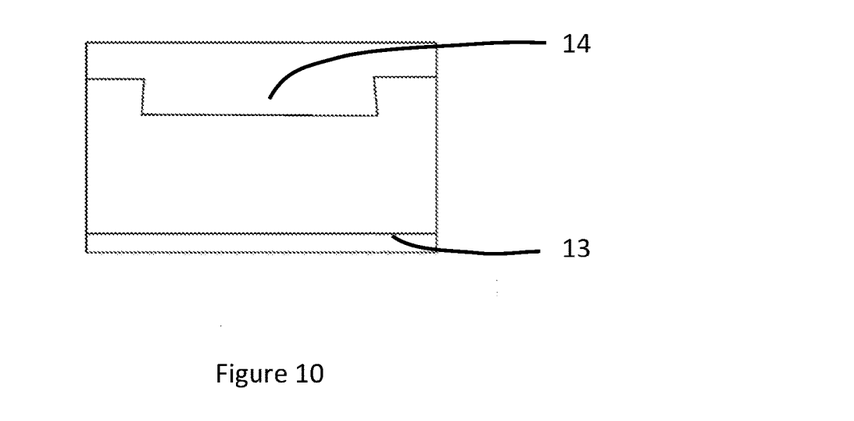
Figure 11:
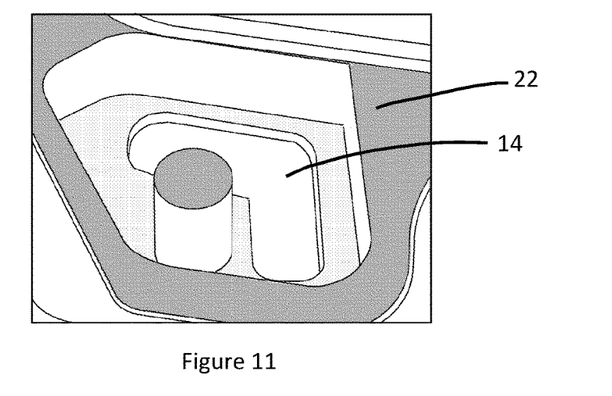
Figure 12:
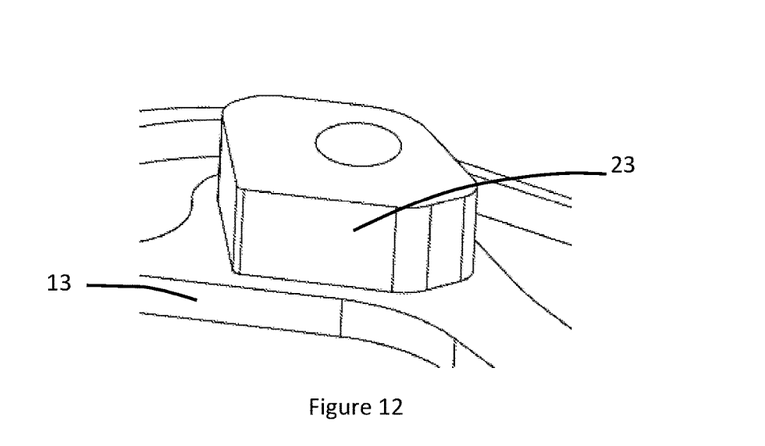

FIGS. 9 to 12 illustrate, by way of example, the manufacture of a jumper. FIGS. 9 and 10 illustrate the result obtained after an intermediate step of producing a cavity 14 in a first metal layer 13. FIG. 10 makes it possible in particular to visualize the dovetail shape obtained for the cavity 14. FIG. 11 shows the intermediate result after formation of the second level resist mold 22. The cavity 14 at the bottom of the mold can be seen. The component is finalized by growth of a second metal layer 23, in order to form the second level of the jumper, as illustrated in FIG. 12.

According to one variant of the embodiment, the process may comprise a step of adding an insert to at least one portion of a cavity 14, followed by a step of growth of a new metal layer, which makes it possible not only to interlock the new metal layer in the preceding layer but also to firmly attach the insert to the final component, and in particular to the two superposed layers, to bury it. The insert may thus be simply placed or driven (or chased) in the cavity. This insert may be made of metallic or conductive material, or of an insulating material such as ruby, silicon or ceramic.

Moreover, one variant of the manufacturing process described above is obtained by carrying out the early removal of the substrate 10 from the rest of the structure, and optionally of the optional conductive layer 11.

In practice, this removal may be carried out as soon as the first metal layer is manufactured, i.e. after carrying out step E2 described above, the result of which is illustrated by FIG. 3. This results in a firmly attached sheet formed from the first metal layer 13 and the resist 12, i.e. the first level N1 of the structure. This sheet finally fulfills the role of substrate for the continuation of the process.

This early separation of the sheet from the substrate 10 has the following primary advantages:

it still enables the continuation of the manufacturing process, such as for example the formation of a blind cavity (step E3) in the metal layer 13 of the sheet, but also the production of one or more additional resist molds 22 (step E4), and the galvanic deposition or electroplating in order to form a new metal layer 23 (step E5), and the repetition of these steps in order to form additional superposed layers, and optionally the insertion of an article (insert);

it also still enables optional leveling, intermediate machining, etc. operations;

the sheet is thin and easy to handle for the implementation of these operations.

This embodiment variant also enables the implementation of steps of the process that are impossible to implement without the removal of the substrate. In particular, it makes it possible to construct elements of the metal component beneath the sheet, more precisely starting from the lower surface 18 of the first metal layer 13. For example, one or more other metal layers may be added by growth to this metal layer, by galvanic deposition or electroplating, for example by a LIGA process as described above. If a conductive layer 11 was deposited prior to the deposition of the first metal layer 13, it is possible either to retain this conductive layer for the subsequent operations, or to remove it. The sheet then acts as initial support starting from which it is possible to add metal layers over and underneath the first metal layer 13. One advantage of the addition of a layer underneath this sheet is to benefit from the flatness of the lower surface 18 previously constructed on the support 10. Thus, for a three-level metal component to be manufactured, it is advantageous to position two layers respectively over and underneath the sheet in order to benefit from the well-controlled flatness of the upper 15 and lower 18 two surfaces of the sheet.

Naturally, it is also possible to carry out a step of forming a cavity in the lower surface 18 of the first metal layer 13, in order to obtain an interlocking of the metal layer formed underneath this surface, in a manner similar to the description explained above. As an observation, the first metal layer 13 of the sheet may thus comprise cavities 14 both in its upper part and in its lower part.

As an observation, it is possible to deposit a conductive layer on one of the surfaces of the metal layer, or on both surfaces. As an observation, the expression "growth underneath this layer or surface" means, in the aforegoing context, "on or starting from the lower surface of the layer detached from the substrate", the growth taking place starting from the lower surface 18.

Figure 13:
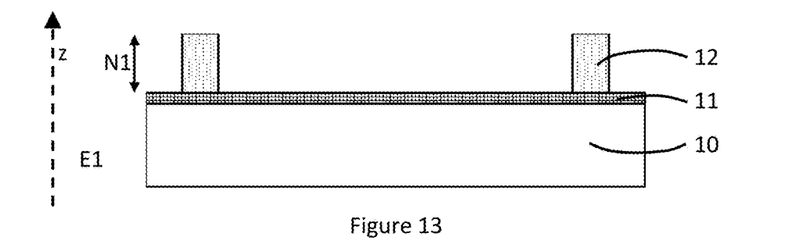
FIGS. 13 to 18 illustrate the successive steps of the process for manufacturing a metal component according to one variant of the embodiment of the invention.
Figure 14:
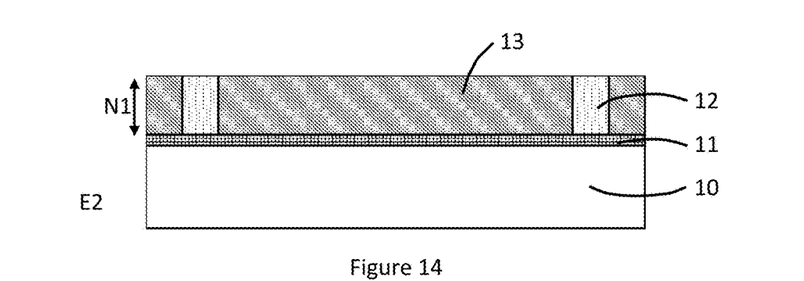
Figure 15:
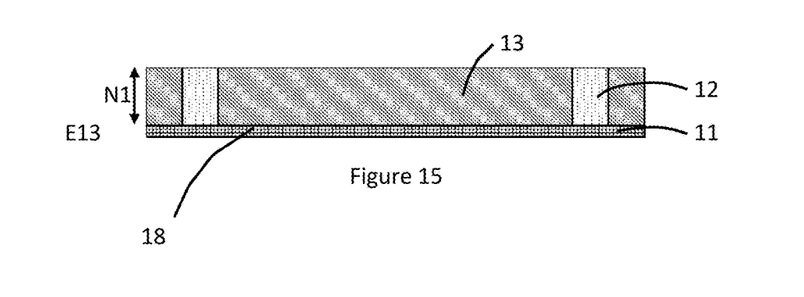
Figure 16:
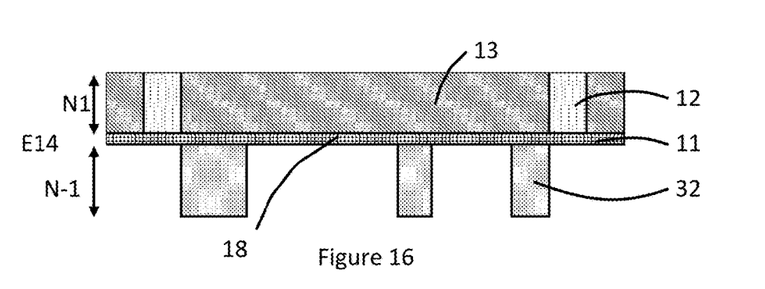
Figure 17:
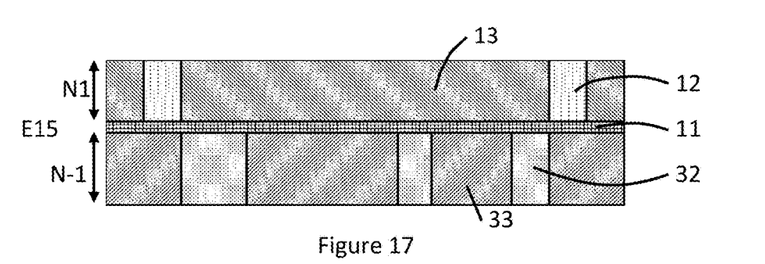
Figure 18:
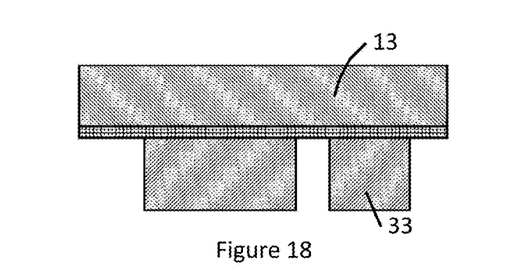

Thus, FIGS. 13 to 18 partially illustrate the implementation of the variant of the manufacturing process described above by carrying out the early removal of the substrate 10. FIGS. 13 and 14 illustrate the manufacture of a first metal layer 13 on a substrate 10 (steps E1 and E2), as was described in reference to FIGS. 2 and 3. At this stage, the substrate 10 is detached or removed, in a step E13, in order to attain the structure represented in FIG. 15, referred to as a sheet. FIG. 16 illustrates a step E14 of producing a resist mold 32 starting from the lower surface of the sheet, in the same way as in the steps E1 and E4 described in detail above, before a step E15 of growth of a metal layer 33 delimited by this mold 32, still according to the same process as that described in detail above, for example carried out in steps E2 and E5. This process thus defines a second level N−1, extending vertically beneath the first level N1. After removal of the resist, in a step E16, a two-level metal component is obtained, as illustrated by FIG. 18.

Next, other layers may be produced on top of the upper metal layer 13 of this two-level metal component, by the implementation of the steps E3 to E5, and their optional repetition, as described above. All the steps described above may be carried out on this component. In addition and/or as a variant, one or more other metal layers may be added starting from the lower surface of this two-level metal component, by growth of the layers starting from this surface, using steps equivalent to steps E3 to E5 described above. As a variant, the resist may be removed at a subsequent moment of the process.

According to another embodiment variant, the early removal of the substrate may be carried out at any other subsequent step of the process. For example, this removal could be carried out just before the formation of the last metal layer of the component, and therefore before the last step of galvanic deposition or electroplating, and optionally before the last step of forming a resist mold. At the latest, this removal could be carried out before the last optional operations for leveling or machining the upper surface obtained during the last step of galvanic deposition or electroplating. As a variant, this removal could be carried out before a last operation for leveling the upper surface obtained during the last step of galvanic deposition or electroplating. As a variant, this removal could be carried out before a last operation for machining the upper surface obtained during the last step of galvanic deposition or electroplating.

The invention also relates to a multi-level timepiece component per se, obtained by the process as described above. Thus, such a timepiece component comprises two adjacent levels formed by two separate metal layers 13, 23 that are at least partially superposed, wherein the first metal layer 13 has at least one blind cavity 14 and wherein the second metal layer 23 occupies the volume of said cavity 14 of the first metal layer, and therefore wherein the second layer comprises an extension 27 which fills this cavity. These two layers were manufactured by galvanic deposition or electroplating, which ensures their attachment at their interface, both between their respective upper and lower two contact surfaces, at the boundary between the two levels of the component, and to the contact surfaces within the cavity 14 of the first metal layer. The cavity may be blind, that is to say that it does not pass completely through the component and that it does not reach the substrate, and therefore that its lower surface lies in the bulk of a layer deposited on the substrate. It may have a side wall that is not perpendicular to the boundary surface between the layers level on the cavity, for example an inclined side wall, for example forming a dovetail cross section. As a variant, the cavity may be a through cavity, that is to say it may occupy the entire height of the first layer, and may comprise a side wall that is not perpendicular to the upper surface of the first layer, for example an inclined side wall, for example forming a dovetail cross section.

The invention claimed is:

1. A timepiece component, comprising two adjacent levels formed by first and second separate metal layers that are at least partially superposed, the second metal layer at least partially covering an upper surface of the first metal layer, wherein the first metal layer has at least one blind cavity and wherein the second metal layer occupies a volume of said blind cavity of the first metal layer, so that the first and second metal layers are interlocked and fastened to one another at an interface thereof.

2. The timepiece component as claimed in claim 1, which is selected from the group consisting of a jumper, a pallet, a wheel, a cam, and a rack.

3. A timepiece movement or timepiece part, comprising the timepiece component as claimed in claim 1.

4. The timepiece component as claimed in claim 1, wherein the second metal layer is beyond the upper surface of the first metal layer and above the cavity, the second metal layer having a height greater than or equal to 10 µm.

5. The timepiece component as claimed in claim 1, wherein the at least one cavity comprises at least one blind hole, the blind hole having a depth of less than or equal to 90% of a height of the metal layer.

6. A timepiece component, comprising two adjacent levels formed by first and second separate metal layers that are at least partially superposed, the second metal layer at least partially covering the upper surface of the first metal layer, wherein the first metal layer has at least one cavity having a side wall that is not perpendicular to an upper surface of the first metal layer in an area around the cavity, and wherein the second metal layer occupies a volume of said cavity of the first metal layer, so that the first and second metal layers are interlocked and fastened to one another at an interface thereof, wherein the interface includes a portion located at the side wall that is not perpendicular to the upper surface of the first metal layer in the area around the cavity.

7. The timepiece component as claimed in claim 6, wherein at least one selected from the group consisting of (i) a cross section of the cavity of the first metal layer increases on moving away from the upper surface of the first metal layer, and (ii) a cross section of the cavity of the first metal layer has a dovetail shape in a plane perpendicular to the upper surface of the component.

8. The timepiece component as claimed in claim 6, which is selected from the group consisting of a jumper, a pallet, a wheel, a cam, and a rack.

9. A timepiece movement or timepiece part, comprising the timepiece component as claimed in claim 6.

10. The timepiece component as claimed in claim 6, wherein the second metal layer is beyond the upper surface of the first metal layer and above the cavity, the second metal layer having a height greater than or equal to 10 µm.

11. The timepiece component as claimed in claim 6, wherein the at least one cavity comprises forming at least one blind hole, the blind hole having a depth of less than or equal to 90% of a height of the metal layer.

12. A process for manufacturing a timepiece component, comprising:
  manufacturing at least one first metal layer of the timepiece component having an upper surface;
  forming at least one cavity in the upper surface of the first metal layer of the timepiece component, by machining of said upper surface of the first metal layer;
  forming a second metal layer at least partially superposed on said upper surface comprising the cavity, by a galvanic deposition of a metal or of an alloy, filling said at least one cavity,
  so as to obtain the timepiece component according to claim 1.

13. The process for manufacturing a timepiece component as claimed in claim 12, wherein the forming of the second metal layer of the timepiece component comprises:
  depositing a photoresist on the upper surface comprising the at least one cavity;
  exposing the photoresist through a mask and developing the resist in order to form a mold, freeing up at least one cavity of the upper surface;
  depositing a metal or an alloy galvanically in the at least one cavity and filling at least one portion of the height of the mold.

14. The process for manufacturing a timepiece component as claimed in claim 12, wherein the forming of the at least one cavity comprises producing at least one side wall not perpendicular to the upper surface of the first metal layer, so that said cavity comprises a flat cross section greater, at at least one depth below a level of the upper surface, than a cross section of an opening of the cavity level with the upper surface.

15. The process for manufacturing a timepiece component as claimed in claim 12, comprising:
  depositing a photoresist on a flat surface of a substrate;
  exposing the photoresist through a mask and developing the photoresist in order to form a first mold;
  depositing a metal or an alloy galvanically in the mold in order to form a first metal layer having a surface;
  optionally superposing one or more other metal layers on the surface of the first metal layer in order to obtain a structure having one or more metal layers including the first metal layer having the upper surface;
  separating the structure from the substrate; then,
  forming at least one cavity in the upper surface forming a substantially flat surface of the first metal layer; then
  producing the at least one second metal layer of the timepiece component, filling said at least one cavity and being superposed on said at least one cavity.

16. The process as claimed in claim 12, comprising machining the surface of the second metal layer formed by galvanic deposition, in order to increase a flatness of the second metal layer, wherein the second metal layer comprises at least one cavity.

17. A process for manufacturing a timepiece component, comprising:
  manufacturing at least one metal layer of the timepiece component including a first metal layer having an upper surface;
  forming at least one cavity in the upper surface of the first metal layer of the timepiece component, by machining of said upper surface of the first metal layer;
  forming a second metal layer at least partially superposed on said upper surface comprising the cavity, by a galvanic deposition of a metal or of an alloy, filling said at least one cavity,
  so as to obtain the timepiece component according to claim 6.

18. The process for manufacturing a timepiece component as claimed in claim 17, wherein the forming of the second metal layer of the timepiece component comprises:
  depositing a photoresist on the upper surface comprising the at least one cavity;
  exposing the photoresist through a mask and developing the resist in order to form a mold, freeing up at least one cavity of the upper surface;
  depositing a metal or an alloy galvanically in the at least one cavity and filling at least one portion of the height of the mold.

19. The process for manufacturing a timepiece component as claimed in claim 17, comprising:
  depositing a photoresist on a flat surface of a substrate;
  exposing the photoresist through a mask and developing the photoresist in order to form a first mold;
  depositing a metal or an alloy galvanically in the mold in order to form a metal layer having a surface;
  optionally superposing one or more other metal layers on the surface of the metal layer in order to obtain a structure having one or more metal layers including the first metal layer having the upper surface;
  separating the structure from the substrate; then,
  forming at least one cavity in the upper surface for ring a substantially flat surface of the metal layer; then
  producing the second metal layer of the timepiece component, filling said at least one cavity and being superposed on said at least one cavity.

20. The process as claimed in claim 17, comprising machining the surface of the second metal layer formed by galvanic deposition, in order to increase a flatness of the second metal layer, wherein the second metal layer comprises at least one cavity.

* * * * *